US008775904B2

(12) United States Patent
Dodson et al.

(10) Patent No.: US 8,775,904 B2
(45) Date of Patent: Jul. 8, 2014

(54) EFFICIENT STORAGE OF META-BITS WITHIN A SYSTEM MEMORY

(75) Inventors: John S. Dodson, Pflugerville, TX (US); Benjiman L. Goodman, Cedar Park, TX (US); Steven J. Hnatko, Fishkill, NY (US); Kenneth L. Wright, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 215 days.

(21) Appl. No.: 13/313,364

(22) Filed: Dec. 7, 2011

(65) Prior Publication Data
US 2013/0151929 A1 Jun. 13, 2013

(51) Int. Cl.
| | |
|---|---|
| *G11C 29/42* | (2006.01) |
| *G06F 11/10* | (2006.01) |
| *G11C 29/54* | (2006.01) |
| *G11C 29/04* | (2006.01) |

(52) U.S. Cl.
CPC .... *G06F 11/1076* (2013.01); *G11C 2029/0411* (2013.01)
USPC .......................................... 714/766; 714/764

(58) Field of Classification Search
CPC ............ G06F 11/1076; G06F 11/1008; G06F 11/1068; G11C 2029/0411; H03M 13/09; H04L 1/0057; H04L 1/0045
See application file for complete search history.

(56) References Cited

U.S. PATENT DOCUMENTS

| | | | |
|---|---|---|---|
| 6,163,857 A | 12/2000 | Meaney et al. | |
| 6,175,942 B1 | 1/2001 | Pawlowski | |
| 6,282,686 B1 | 8/2001 | Cypher | |
| 7,171,591 B2 | 1/2007 | Chen | |
| 7,353,445 B1 * | 4/2008 | Barreh et al. | 714/758 |
| 7,437,597 B1 | 10/2008 | Kruckemyer et al. | |
| 7,587,658 B1 | 9/2009 | Tong et al. | |
| 7,890,836 B2 * | 2/2011 | Eilert | 714/758 |
| 7,987,321 B1 * | 7/2011 | Agarwal et al. | 711/141 |
| 2002/0144181 A1 | 10/2002 | Hicks et al. | |
| 2004/0003335 A1 * | 1/2004 | Gertz et al. | 714/758 |
| 2005/0188292 A1 | 8/2005 | Chen | |
| 2007/0168618 A1 | 7/2007 | Clark et al. | |
| 2007/0174679 A1 | 7/2007 | Chelstrom et al. | |
| 2008/0307286 A1 | 12/2008 | Lilly et al. | |
| 2009/0177878 A1 * | 7/2009 | Gao et al. | 713/100 |
| 2009/0182816 A1 * | 7/2009 | Yu | 709/206 |
| 2010/0293438 A1 | 11/2010 | Lastras-Montano et al. | |
| 2010/0299576 A1 | 11/2010 | Baysah et al. | |
| 2011/0041016 A1 | 2/2011 | O'Connell | |
| 2011/0185251 A1 | 7/2011 | d'Abreu et al. | |

OTHER PUBLICATIONS

U.S. Appl. No. 13/611,909, Sep. 12, 2012, 1 page.

(Continued)

*Primary Examiner* — Ajay Bhatia
*Assistant Examiner* — Dipakkumar Gandhi
(74) *Attorney, Agent, or Firm* — Stephen R. Tkacs; Stephen J. Walder, Jr.; Matthew B. Talpis

(57) ABSTRACT

Mechanisms are provided for efficient storage of meta-bits within a system memory. The mechanisms combine an L/G bit and an SUE bit to form meta-bits. The mechanisms then determine the local/global state of a cache line on the first cycle of data. The mechanisms forward the data to the requesting cache, and the requesting cache may reissue the request globally based on the local/global state of the cache line. The mechanisms then determine the special uncorrectable error state of the cache line on the second or subsequent cycle of data. The mechanisms perform error processing regardless of whether the request was reissued globally.

13 Claims, 3 Drawing Sheets

(56) References Cited

OTHER PUBLICATIONS

IBM Corporation, "Method for update bits to improve recoverability from uncorrectable errors for last-level cache", Technical Disclosure, IPCOM000143907D, Dec. 12, 2006, 3 pages.

Mielke, Neal et al., "Bit Error Rate in NAND Flash Memories", IRPS IEEE International, Apr. 27-May 1, 2008, pp. 9-19.

International Search Report and Written Opinion, International Application No. PCT/JP2012/007378 Dated Jan. 8, 2013, 6 pages.

* cited by examiner

FIG. 3
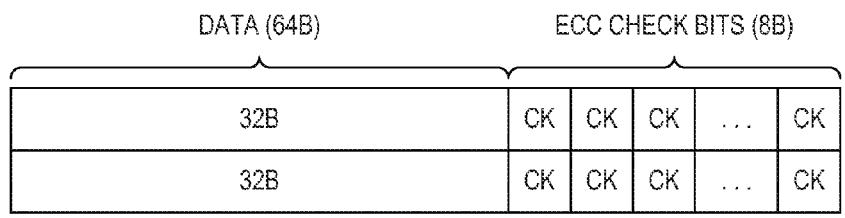
FIG. 4
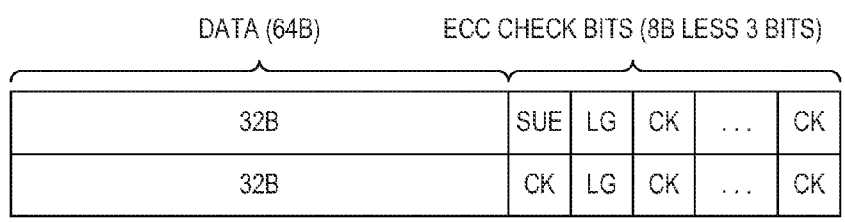
FIG. 5
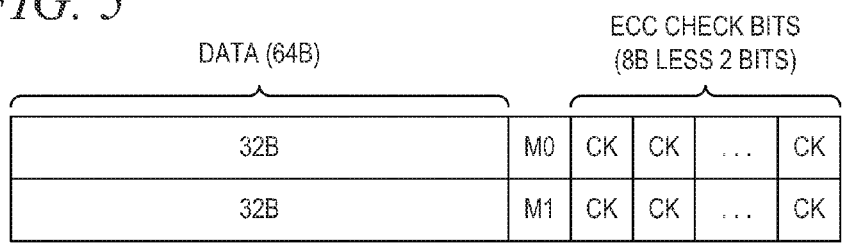
| M0 | M1 | MEANING |
|----|----|---------|
| 0  | 0  | L/G = LOCAL, SUE = 0 |
| 0  | 1  | L/G = GLOBAL, SUE = 1 |
| 1  | 0  | L/G = GLOBAL, SUE = 1 |
| 1  | 1  | L/G = GLOBAL, SUE = 0 |
FIG. 6

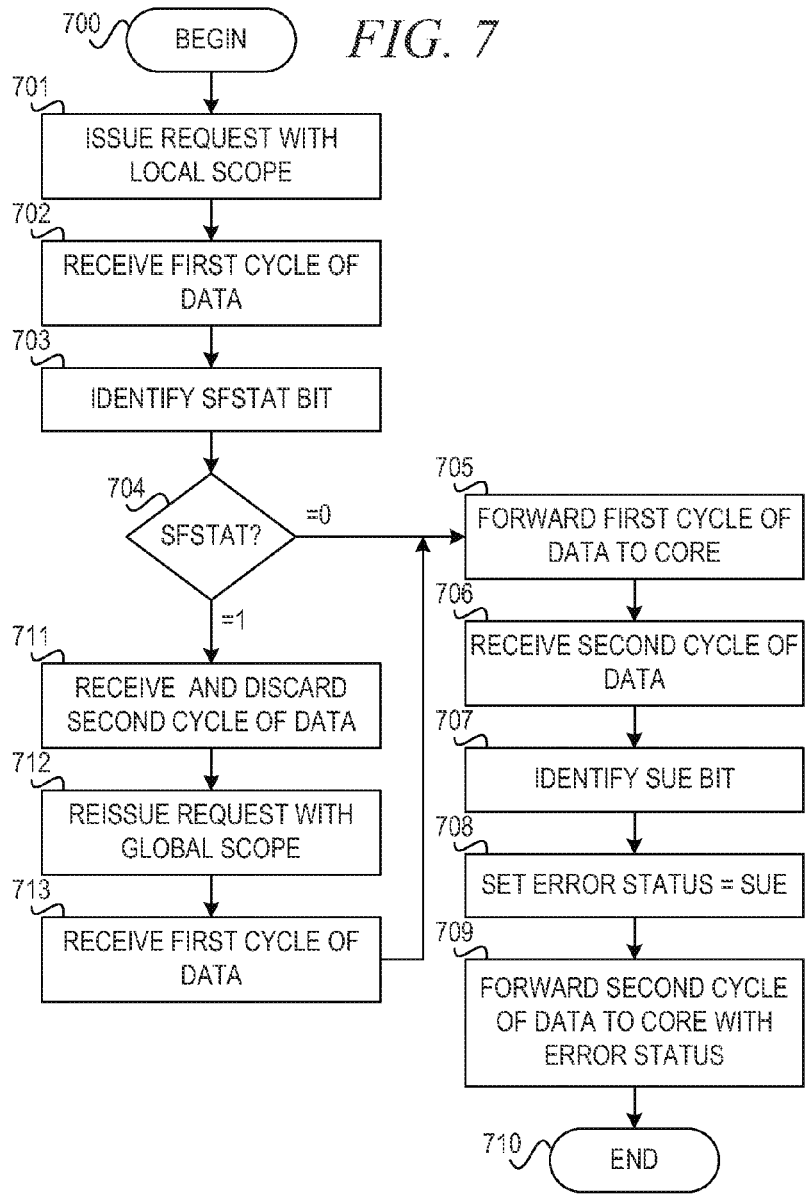

EFFICIENT STORAGE OF META-BITS WITHIN A SYSTEM MEMORY

BACKGROUND

The present application relates generally to an improved data processing apparatus and method and more specifically to mechanisms for efficiently storing meta-bits within a system memory.

There is a growing trend for microprocessors to include many cores. A multi-core processor is a single computing component with two or more independent actual processors (called "cores"), which are the units that read and execute program instructions. The instructions are ordinary central processor unit (CPU) instructions, such as add, move data, and branch, but the multiple cores can run multiple instructions at the same time, increasing overall speed for programs amenable to parallel computing. Manufacturers typically integrate the cores onto a single integrated circuit die (known as a chip multiprocessor or CMP), or onto multiple dies in a single chip package.

In computing, symmetric multiprocessing (SMP) involves a multiprocessor computer hardware architecture where two or more processors are connected to a single shared main memory and are controlled by a single OS instance. In the case of multi-core processors, the SMP architecture may apply to the cores, treating them as separate processors. When an SMP system is built from multiple core chips, a significant burden is placed on coherent interconnect design and technology to provide for growing snoop bandwidth requirements. Wider interconnects result in more complex and expensive processor modules and system boards, which results in greater snoop bandwidth.

Cache coherency refers to the consistency of data stored in local caches of a shared resource. When components in a system maintain caches of a common memory resource, problems may arise with inconsistent data. This is particularly true of processing units in a multiprocessing system. If a first processing core has a copy of a memory block from a previous read and a second processing core changes that memory block, the first processing could be left with an invalid cache of memory without any notification of the change. Cache coherency is intended to manage such conflicts and maintain consistency between cache and memory.

SUMMARY

In one illustrative embodiment, a method, in a data processing system, is provided for performing a memory request. The method comprises storing a cache line in a plurality of data blocks. Each data block in the plurality of data blocks has a set of error correction code bits and a single meta-bit. The meta-bits of the plurality of data blocks combine to indicate a local/global state and a special uncorrectable error bit. The method further comprises issuing a request for the cache line locally. The method further comprises receiving a first block of data, of the plurality of blocks of data, in a first cycle and identifying a meta-bit of the first block of data. The method further comprises determining a local/global state of the cache line based on the meta-bit of the first block of data.

In another illustrative embodiment, an apparatus comprises a plurality of processor cores, a cache coupled to a first processor core with the plurality of processor cores, and a memory. The cache is configured to receive memory requests from the processor core and store cache lines of data to be accessed by the processor core. The memory stores a cache line in a plurality of data blocks. Each data block in the plurality of data blocks has a set of error correction code bits and a single meta-bit. The meta-bits of the plurality of data blocks combine to indicate a local/global state and a special uncorrectable error bit. The cache is configured to issue a request for the cache line locally. The cache is configured to receive a first block of data, of the plurality of blocks of data, in a first cycle and identity a meta-bit of the first block of data. The cache is configured to determine a local/global state of the cache line based on the meta-bit of the first block of data.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 3 depicts an example of a cache line with error correction code;

FIG. 4 depicts an example of a cache line with error correction code, local/global bit, and special uncorrectable error bit in accordance with an example embodiment;

FIG. 5 depicts an example of a cache line with meta-bits indicating local/global bits and special uncorrectable error bit in accordance with an illustrative embodiment;

FIG. 6 is a table illustrating the combined L/G and SUE states represented by the meta-bits in accordance with an illustrative embodiment; and FIG. 7 is a flowchart illustrating operation of a mechanism in a cache processing a request in accordance with an illustrative embodiment.

DETAILED DESCRIPTION

Figure 1:
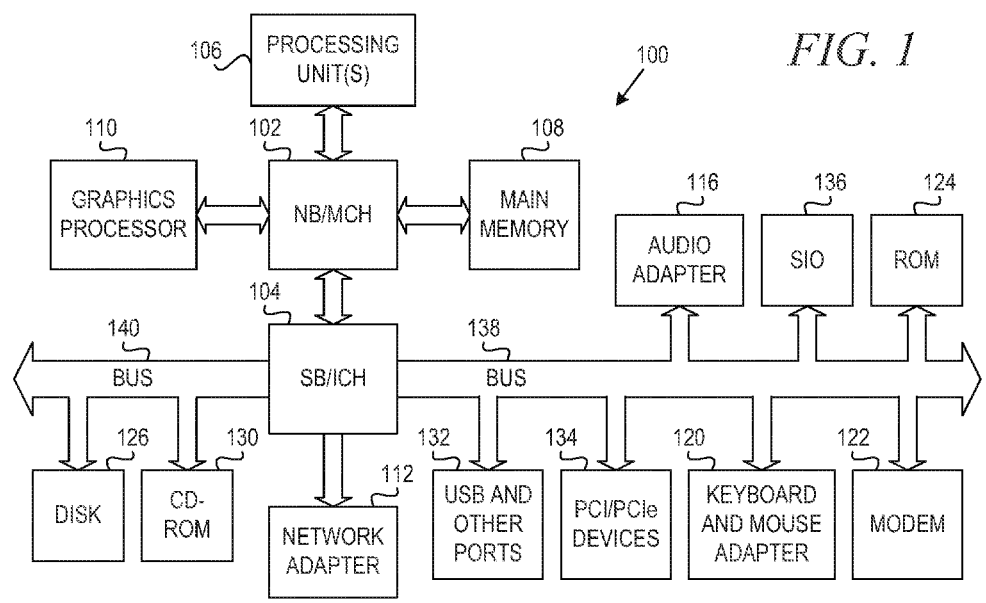
FIG. 1 is a block diagram of an example data processing system in which aspects of the illustrative embodiments may be implemented.
Figure 2:
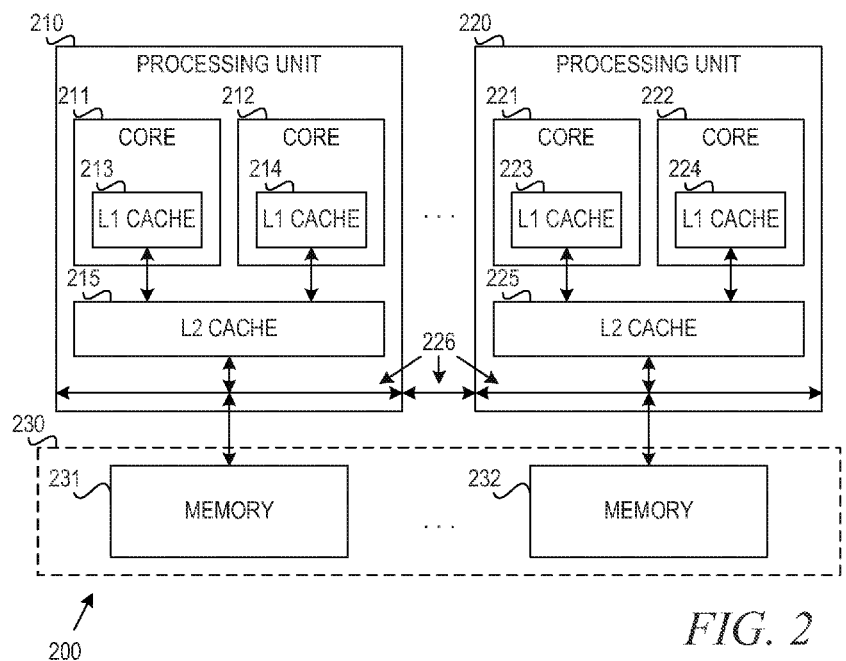
FIG. 2 is a block diagram of an example cache hierarchy in a data processing system in which aspects of the illustrative embodiments may be implemented.

The illustrative embodiments provide a mechanism for efficient storage of meta-bits within a system memory. The illustrative embodiments may be utilized in many different types of data processing environments. In order to provide a context for the description of the specific elements and functionality of the illustrative embodiments, FIGS. 1 and 2 are provided hereafter as example environments in which aspects of the illustrative embodiments may be implemented. It should be appreciated that FIGS. 1 and 2 are only examples and are not intended to assert or imply any limitation with regard to the environments in which aspects or embodiments of the present invention may be implemented. Many modifications to the depicted environments may be made without departing from the spirit and scope of the present invention.

FIG. 1 is a block diagram of an example data processing system in which aspects of the illustrative embodiments may be implemented. Data processing system 100 is an example of a computer in which computer usable code or instructions implementing the processes for illustrative embodiments of the present invention may be located.

In the depicted example, data processing system 100 employs a hub architecture including north bridge and memory controller hub (NB/MCH) 102 and south bridge and input/output (I/O) controller hub (SB/ICH) 104. Processing unit 106, main memory 108, and graphics processor 110 are connected to NB/MCH 102. Graphics processor 110 may be connected to NB/MCH 102 through an accelerated graphics port (AGP).

In the depicted example, local area network (LAN) adapter 112 connects to SB/ICH 104. Audio adapter 116, keyboard and mouse adapter 120, modem 122, read only memory (ROM) 124, hard disk drive (HDD) 126, CD-ROM drive 130, universal serial bus (USB) ports and other communication ports 132, and PCI/PCIe devices 134 connect to SB/ICH 104 through bus 138 and bus 140. PCI/PCIe devices may include, for example, Ethernet adapters, add-in cards, and PC cards for notebook computers. PCI uses a card bus controller, while PCIe does not. ROM 124 may be, for example, a flash basic input/output system (BIOS).

HDD 126 and CD-ROM drive 130 connect to SB/ICH 104 through bus 140. HDD 126 and CD-ROM drive 130 may use, for example, an integrated drive electronics (IDE) or serial advanced technology attachment (SATA) interface. Super I/O (SIO) device 136 may be connected to SB/ICH 104.

An operating system runs on processing unit 106. The operating system coordinates and provides control of various components within the data processing system 100 in FIG. 1. As a client, the operating system may be a commercially available operating system such as Microsoft Windows 7 (Microsoft and Windows are trademarks of Microsoft Corporation in the United States, other countries, or both). An object-oriented programming system, such as the Java programming system, may run in conjunction with the operating system and provides calls to the operating system from Java programs or applications executing on data processing system 100 (Java is a trademark of Oracle and/or its affiliates.).

As a server, data processing system 100 may be, for example, an IBM® eServer™ System p® computer system, running the Advanced Interactive Executive (AIX®) operating system or the LINUX operating system (IBM, eServer, System p, and AIX are trademarks of International Business Machines Corporation in the United States, other countries, or both, and LINUX is a registered trademark of Linus Torvalds in the United States, other countries, or both). Data processing system 100 may be a symmetric multiprocessor (SMP) system including a plurality of processors in processing unit 106. Alternatively, a single processor system may be employed.

Instructions for the operating system, the object-oriented programming system, and applications or programs are located on storage devices, such as HDD 126, and may be loaded into main memory 108 for execution by processing unit 106. The processes for illustrative embodiments of the present invention may be performed by processing unit 106 using computer usable program code, which may be located in a memory such as, for example, main memory 108, ROM 124, or in one or more peripheral devices 126 and 130, for example.

A bus system, such as bus 138 or bus 140 as shown in FIG. 1, may be comprised of one or more buses. Of course, the bus system may be implemented using any type of communication fabric or architecture that provides for a transfer of data between different components or devices attached to the fabric or architecture. A communication unit, such as modem 122 or network adapter 112 of FIG. 1, may include one or more devices used to transmit and receive data. A memory may be, for example, main memory 108, ROM 124, or a cache such as found in NB/MCH 102 in FIG. 1.

Those of ordinary skill in the art will appreciate that the hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. Also, the processes of the illustrative embodiments may be applied to a multiprocessor data processing system, other than the SMP system mentioned previously, without departing from the spirit and scope of the present invention.

Moreover, the data processing system 100 may take the form of any of a number of different data processing systems including client computing devices, server computing devices, a tablet computer, laptop computer, telephone or other communication device, a personal digital assistant (PDA), or the like. In some illustrative examples, data processing system 100 may be a portable computing device that is configured with flash memory to provide non-volatile memory for storing operating system files and/or user-generated data, for example. Essentially, data processing system 100 may be any known or later developed data processing system without architectural limitation.

FIG. 2 is a block diagram of an example cache hierarchy in a data processing system in which aspects of the illustrative embodiments may be implemented. Data processing system 200 comprises a plurality of processing units 210, 220. Processing unit 210 has a plurality of cores 211, 212. Core 211 has L1 cache 213, and core 212 has L1 cache 214. Similarly, processing unit 220 has a plurality of cores 221, 222. Core 221 has L1 cache 223, and core 222 has L1 cache 224.

Within processing unit 210, cores 211, 212 access L2 cache 215. Within processing unit 220, cores 221, 222 access L2 cache 225. Processing units 210, 220 access shared memory 230, which is distributed among the processing units 210, 220. Processing unit 210 is directly attached to memory 231, and processing unit 220 is directly attached to memory 232; however, processing unit 210 may access memory 232, and processing unit 220 may access memory 231. While the example shown in FIG. 2 depicts two levels of cache (L1 and L2), the overall cache hierarchy may include any number of levels. L2 cache 215 and L2 cache 225 access memory 231 and memory 232 via coherent interconnect 226, which comprises a coherent interconnect fabric (bus) between the processing units. Cache operations involving snooping and the like are performed using coherent interconnect 226.

If core 211 accesses data from memory 231, L1 cache 213 stores a cache line, which is also stored in L2 cache 215. If core 222 accesses the same data address in memory 231, L1 cache 224 issues a request for the cache line from L2 cache 225. The caches must perform cache coherency to ensure the integrity of the caches. Cache coherency protocols involve each cache snooping memory accesses to determine when a cache line becomes invalid. In a multiprocessing system, such as data processing system 200, which could potentially include many processing units each having many processing cores, wide interconnects may result in more complex and expensive processor modules and system boards, which results in the need for greater snoop bandwidth on coherent interconnect 226.

One mechanism to reduce snoop bandwidth on coherent interconnect 226, outside a given processor module, is to include a "local/global" bit (L/G bit) in each cache block of data in memory. This bit indicates whether a processor/cache outside the chip contains a copy of this data. When a local processor requests a block of data from within the portion of system memory that is locally attached, the processor initially indicates a "local" access, speculating the L/G bit will indicate "local." When the data is returned from the local memory, the processor/cache logic examines the L/G bit returned with the data. If the block has not been accessed by a remote processor/cache, then the data may be forwarded to the core, and the command does not have to be re-issued globally. If the L/G bit indicates "global," then the data is not forwarded to the requesting core, and the memory request must be reissued with a global scope. Although the L/G bit represents a two-tiered command scope, the illustrative embodiments may be applicable in any multi-tiered command scope design.

A memory may transfer cache blocks to higher level caches in multiple cycles (beats) due to limited bus widths. For example, a 64-byte (64 B) cache line may be transferred across two cycles, 32 bytes (32 B) per cycle. Depending on the request address, the memory may return two 32 B segments of a 64 B line in either order. For performance reasons, the sooner the requesting cache receives the L/G bit from memory, the sooner the cache can either forward the critical data to the core or reissue the request globally. Thus, it is ideal to return the L/G bit with the first cycle of data regardless of which segment is returned first. The more cycles it takes to transfer a line across a bus, the more important it is to return the L/G bit as early as possible to mitigate the trailing edge latency effect.

In addition to the L/G bit, some high reliability, accessibility, and serviceability (RAS) systems may maintain a special uncorrectable error (SUE) bit in memory for each cache line. The SUE bit indicates that an uncorrectable error was detected within the system before the cache line was written back to memory (e.g., during a cache castout). When the data is re-read from memory, the SUE bit flags the data as bad and informs the diagnostic code that the error did not originate in system memory. This information aids in isolating and tracking faults within a system.

Most computer systems use industry standard dynamic random access memory (DRAM) devices. Typical memory is almost exclusively partitioned with a minimum bus width of 72 bits. This allows for 8 bits of error correction code (ECC) for every 64 bits of data. From these building blocks, larger data structures are realized with the same 8:1 data-to-ECC ratio. For example, a 64 byte cache block can be supported by 8 bytes of ECC.

FIG. 3 depicts an example of a cache line with error correction code. All ECC codes have an associated miscorrect rate. In other words, there is a finite probability that the code will not correct otherwise correctable errors properly. More ECC check bits for a given amount of data result in a lower miscorrect rate. Fewer ECC check bits result in a higher miscorrect rate. As seen in FIG. 3, a 64 B cache line is separated into two 32 B data blocks, each having 4 B of ECC check bits (according to the 8:1 ratio).

The problem with tracking an L/G bit and SUE bit for every cache line in memory is that these bits reduce the number of ECC check bits available for error detection and correction. FIG. 4 depicts an example of a cache line with error correction code, local/global bit, and special uncorrectable error bit in accordance with an example embodiment. In the depicted example, the L/G bit is replicated for each 32 B of data so it will be available as soon as possible regardless of which 32 B segment is the critical segment (i.e., which is read and returned to the requesting cache first). Therefore, out of 8 B for the two 32 B segments combined, three bits must be used for L/G and SUE, while 61 bits (8 B minus 3 bits) may be used as ECC check bits, In some high-end server environments, the level of memory RAS and resulting miscorrect rate requirements may be so strict that it precludes the implementation of performance optimizations such as the L/G bit or having multiple copies of the bit per cache line.

The illustrative embodiments provide an efficient mechanism for storing meta-bits for a critical granule of a cache line while minimizing the number of ECC check bits consumed for the SUE bit and L/G bit. The illustrative embodiments recognize that if a cache line is marked with an SUE bit in memory, then the state of the L/G bit may be indeterminate and, therefore, a requesting cache must treat the cache line as global. The illustrative embodiments minimize the degradation of the ECC miscorrect rates while still providing L/G information for each cache segment by combining the SUE indication with the L/G information into two meta-bits.

When a processor/cache requests a cache line of data from memory, the cache may not receive an indication that the data is bad until the second (or later) cycle. For example, if it takes four cycles to receive a 128 B cache line (32 B per cycle), the error indication my not arrive until the fourth cycle. For performance reasons, it may not be desirable to hold up the first three cycles of data waiting for the error indication, particularly because these types of errors are very rare.

In the example shown in FIG. 4, it takes two cycles to receive a 64 B cache line (32 B per cycle). The SUE indication may not arrive until the second cycle. It would be advantageous to provide the first cycle of data to the core to speculatively begin processing.

FIG. 5 depicts an example of a cache line with meta-bits indicating local/global bits and special uncorrectable error bit in accordance with an illustrative embodiment. These meta-bits, M0 and M1, combine the SUE information and the L/G state. FIG. 6 is a table illustrating the combined L/G and SUE states represented by the meta-bits in accordance with an illustrative embodiment. Note that when SUE=0, the M0 and M1 bits contain the same value and reflect the true state of the L/G bit. Therefore, if SUE=0, which is true in most cases, the cache gets the same value regardless of which cycle is returned first.

It should be noted the states of zero (0) and one (1) are representations of binary values that could be interchanged without affecting the functionality described herein. In other words, a state of one could represent a value of true while a state of zero represents a value of false, and alternatively a state of zero could represent a value of true while a state of zero represents a value of false. As used in this description, a state of one (1) represents a true value or assertion, and a state of zero (0) represents a false value or deassertion.

If SUE=1, the cache loses the true state of the L/G bit; however, regardless of whether the requesting cache receives L/G=0 or L/G=1 with the critical (first) cycle of data, the cache will subsequently see the SUE indication. Upon seeing the SUE indication, the cache will initiate error handling procedures by forwarding an error status indication to the core along with the data, regardless of whether the request was handled locally or reissued globally. The same is true if a true uncorrectable error was detected on the memory read in which the meta-bits could have been corrupted.

In accordance with the illustrative embodiment, the first cycle (critical beat) can be forwarded to the processor core before the memory error status is known. The core can use the data but will not finish the instruction until the error status is known for the data. However, if the state of the L/G bit is not known when the first beat of data arrives, the critical beat of data cannot be forwarded to the core because the read request may need to be reissued with global scope (if L/G=global). Because coherent operations can always be issued globally, with a resulting increase in snoop bandwidth demand, if a cache line is marked with a SUE, the state of the L/G bit can be assumed to be "global," even if the data is not actually resident in any remote cache. A cache line marked with SUE is a very rare occurrence; therefore, defaulting the state of L/G to "global" in the presence of an SUE has very little impact on performance.

The state of L/G is communicated to the requesting cache via a "snoop filter status" signal (SFSTAT). This signal is sent by the memory controller to the requesting cache coincident with the first cycle of data. The state of the SFSTAT signal is equal to the state of the meta bit (M0 or M1) that happens to accompany the critical cycle of data, When the memory controller receives the second (i.e., last) cycle of data, it decodes the two meta bits and, if not equal, asserts an SUE indicator which accompanies the second (i.e., last) cycle of data returned to the requesting cache. The cache then forwards this error status on to the core coincident with the second/last cycle of data. If error status=1, the core initiates error handling.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

FIG. 7 is a flowchart illustrating operation of a mechanism in a cache processing a request in accordance with an illustrative embodiment. Operation begins in block 700, and the mechanism issues the request with local scope (block 701). The mechanism receives the first cycle of data (block 702) and identifies the snoop filter status bit (SFSTAT) (block 703). The mechanism determines whether the SFSTAT bit in the first cycle is zero or one (block 704). The state of L/G is communicated to the requesting cache via a "snoop filter status" signal (SFSTAT). This signal is sent by the memory controller to the requesting cache coincident with the first cycle of data. The state of the SFSTAT signal is equal to the state of the meta-bit (M0 or M1) that happens to accompany the critical cycle of data.

If SFSTAT=0, the mechanism assumes the L/G state is local, and the mechanism forwards the first cycle of data to the requesting core (block 705). The mechanism then receives the second cycle of data (block 706) and identifies the SUE bit (block 707). The mechanism then sets an error status for the second cycle of data equal to the SUE status (block 708) and forwards the second cycle of data to the core with the error status (block 709). When the memory controller receives the second (i.e., last) cycle of data, it decodes the two meta-bits and, if not equal, asserts an SUE indicator which accompanies the second (i.e., last) cycle of data returned to the requesting cache. Thereafter, operation ends in block 710.

If SFSTAT=1 in block 704, the mechanism receives and discards the second cycle of data (block 711) and reissues the request with global scope (block 712). The operations of blocks 711 and 712 may occur in either order. The mechanism receives the first cycle of data from the request with global scope (block 713).

Then, operation proceeds to block 705, where the mechanism forwards the first cycle of data to the core. The mechanism then receives the second cycle of data (block 706) and identifies the SUE bit (block 707). The mechanism then sets an error status for the second cycle of data equal to the SUE status (block 708) and forwards the second cycle of data to the core with the error status (block 709). Thereafter, operation ends in block 710.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, the illustrative embodiments provide mechanisms for efficient storage of meta-bits within a system memory. The mechanisms combine an L/G bit and an SUE bit to form meta-bits. The mechanisms then determine the local/global state of a cache line on the first cycle of data. The mechanisms forward the data to the requesting cache, and the requesting cache may reissue the request globally based on the local/global state of the cache line. The mechanisms then determine the special uncorrectable error state of the cache line on the second or subsequent cycle of data. The mechanisms perform error processing regardless of whether the request was reissued globally. Thus, the mechanisms of the illustrative embodiments provide the L/G on each beat of data while minimizing the number of ECC check bits used, improving the miscorrect rates compared to discreet SUE and multiple copies of L/G bits.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An apparatus, comprising:
a plurality of processor cores;
a cache coupled to a first processor core with the plurality of processor cores; and
a memory,
wherein the cache is configured to receive memory requests from the processor core and store cache lines of data to be accessed by the processor core, wherein the memory stores a cache line in a plurality of data blocks, wherein each data block in the plurality of data blocks has a set of error correction code bits and a single meta-bit, wherein the meta-bits of the plurality of data blocks combine to indicate a local/global state and a special uncorrectable error bit;
wherein the cache is configured to issue a request for the cache line locally;
wherein the cache is configured to receive a first block of data, of the plurality of blocks of data, in a first cycle;
wherein the cache is configured to identify a meta-bit of the first block of data; and
wherein the cache is configured to determine a local/global state of the cache line based on the meta-bit of the first block of data.

2. The apparatus of claim 1, wherein the cache is configured to forward the first block of data to a requesting processor core responsive to determining the local/global state of the cache line is local.

3. The apparatus of claim 2, wherein the cache is configured to receive a second block of data of the plurality of blocks of data, in a second cycle;
   wherein the cache is configured to identify a meta-bit of the second block of data; and
   wherein the cache is configured to determine a special uncorrectable error state of the cache line based on the meta-bit of the first block of data and the meta-bit of the second block of data.

4. The apparatus of claim 3, wherein the cache is configured to an error status based on the special uncorrectable error state and to forward the second block of data to the requesting processor core with the error status.

5. The apparatus of claim 1, wherein the cache is configured to reissue the request for the cache line globally responsive to determining the local/global state of the cache line is global.

6. The apparatus of claim 5, wherein the cache is configured to receive a second block of data, of the plurality of blocks of data, in a second cycle; and
   wherein the cache is configured to discard the second block of data.

7. A computer program product comprising a n-transitory computer readable storage medium having a computer readable program stored therein, wherein the computer readable program, when executed on a computing device, causes the computing device to:
   issue a request for a cache line locally, wherein the cache line is stored in a plurality of data blocks, wherein each data block in the plurality of data blocks has a set of error correction code bits and a single meta-bit, wherein the meta-bits of the plurality of data blocks combine to indicate a local/global state and a special uncorrectable error bit;
   receive a first block of data, of the plurality of blocks of data, in a first cycle;
   identify a meta-bit of the first block of data; and
   determine a local/global state of the cache line based on the meta-bit of the first block of data.

8. The computer program product of claim 7, wherein the computer readable program further causes the computing device to:
   forward the first block of data to a requesting processor core responsive to determining the local/global state of the cache line is local.

9. The computer program product of claim 8, wherein the computer readable program further causes the computing device to:
   receive a second block of data, of the plurality of blocks of data, in a second cycle;
   identify a meta-bit of the second block of data; and
   determine a special uncorrectable error state of the cache line based on the meta-bit of the first block of data and the meta-bit of the second block of data.

10. The computer program product of claim 9, wherein the computer readable program further causes the computing device to:
    set an error status based on the special uncorrectable error state; and
    forward the second block of data to the requesting processor core with the error status.

11. The computer program product of claim 7, wherein the computer readable program further causes the computing device to:
    reissue the request for the cache line globally responsive to determining the local/global state of the cache line is global.

12. The computer program product of claim 7, wherein the computer readable program is stored in a computer readable storage medium in a data processing system and wherein the computer readable program was downloaded over a network from a remote data processing system.

13. The computer program product of claim 7, wherein the computer readable program is stored in a computer readable storage medium in a server data processing system and wherein the computer readable program is downloaded over a network to a remote data processing system for use in a computer readable storage medium with the remote system.

\* \* \* \* \*